United States Patent [19]

Dautremont-Smith et al.

[11] Patent Number: 5,100,836
[45] Date of Patent: Mar. 31, 1992

[54] METHOD OF MAKING A SEMICONDUCTOR DEVICE

[75] Inventors: William C. Dautremont-Smith; Avishay Katz, both of Westfield; Louis A. Koszi, Scotch Plains; Bryan P. Segner, Piscataway; Peter M. Thomas, Murray Hill, all of N.J.

[73] Assignee: AT&T Bell Laboratories, Murray Hill, N.J.

[21] Appl. No.: 675,304

[22] Filed: Mar. 26, 1991

Related U.S. Application Data

[63] Continuation-in-part of Ser. No. 394,600, Aug. 16, 1989, Pat. No. 5,036,023.

[51] Int. Cl.$^5$ ............................................. H01L 21/44
[52] U.S. Cl. ................................... 437/184; 437/192; 148/DIG. 20
[58] Field of Search .............................. 437/184, 192; 148/DIG. 20, DIG. 71

[56] References Cited

U.S. PATENT DOCUMENTS 4,595,454 6/1986 Dautremont-Smith ............. 156/647
5,036,023 7/1991 Dautremont-Smith et al. ... 437/184

OTHER PUBLICATIONS

"Electron Tunneling and Contact Resistance of Metal-Silicon Contact Barriers", by a. Y. C. Yu, *Solid-State Electronics*, Pergamon Press 1970, vol. 13, pp. 239-247.

"Ohmic Contacts to n—GaAs Using Graded Band Gap Layers of Ga$_{1-x}$In$_x$As Grown by Molecular Beam Epitaxy", by J. M. Woodall et al., *Journal Vacuum Science Technology*, 19(3), Sep./Oct. 1981, pp. 626-627.

"Extremely Low Resistance Non-Alloyed Ohmic Contacts to n—GaAs Using Compositionally Graded In$_x$Ga$_{1-x}$As Layers", by T. Nittono et al., *Japanese Journal of Applied Physics*, vol. 25, No. 10, Oct., 1986, pp. L865-L867.

"A Nonalloyed, Low Specific Resistance Ohmic Contact to n—InP", by W. C. Dautremont-Smith et al., *Journal Vacuum Science Technology*, B2 (4), Oct.-Dec. 1984, pp. 620-625.

"Mechanism of Catastrophic Degradation in InGaAsP-/InP Double-Heterostructure Light Emitting Diodes with Ti/Pt/Au Electrodes", by O. Ueda et al., *Journal Applied Physics*, 54(11), Nov. 1983, pp. 6732-6739.

"The Design and Realization of a High Reliability Semiconductor Laser for Single-Mode Fiber-Optical Communication Links", by A. R. Goodwin et al., *Journal of Lightwave Technology*, vol. 6, No. 9, Sep. 1988, pp. 1424-1434.

"Sputtered Ni—P as an Ohmic Contact to n—InP, p—InGaAs and as a Diffusion Barrier", by A. Appelbaum et al., *IEEE Transactions on Electron Devices*, vol. ED—34, No. 5, May 1987, pp. 1026-1031.

"Heavily Si—Doped InGaAs Lattice-Matched to InP Grown by MBE", by T. Fujii et al., *Electronics Letters*, vol. 22, No. 4, 13th Feb. 1986, pp. 191-192.

"Pt/Ti/p—InGaAsP Nonalloyed Ohmic Contact Formed by Rapid Thermal Processing", by A. Katz et al., *Journal Applied Physics*, 65(11), Jun. 1, 1989, pp. 4319-4323.

"Pt/Ti/p—In$_{0.53}$Ga$_{0.47}$As Low-Resistance Nonalloyed Ohmic Contact Formed by Rapid Thermal Processing", A. Katz et al., *Applied Physics Letters*, 54(23) Jun. 5, 1989, pp. 2306-2308.

*Primary Examiner*—Olik Chaudhuri
*Assistant Examiner*—G. Fourson
*Attorney, Agent, or Firm*—Eugen E. Pacher

[57] ABSTRACT

Disclosed is a method of making a semiconductor device that exemplarily comprises depositing a Ti/Pt layer onto a AuBe intermediate layer on a p-doped region of a semiconductor body. It also comprises depositing a Ti/Pt layer onto a n-doped region of the semiconductor body, or onto a AuGe intermediate layer on the n-doped region, followed by rapid thermal processing. Exemplarily, the device is a semiconductor laser, the n-doped region is InP, the p-doped region is InGaAs or InGaAsP, and RTP involves heating in the range 425°-500° C. for 10-100 seconds. The method comprises fewer processing steps than typical prior art methods, reduces the danger of fabrication error and of wafer breakage and, significantly, results in contacts that can be relatively thermally stable and can have very low specific contact resistance (exemplarily as low as $10^{-7}$ $\Omega\cdot$cm$^2$).

6 Claims, 5 Drawing Sheets

METHOD OF MAKING A SEMICONDUCTOR DEVICE

This application is a continuation-in-part of our co-pending application, Ser. No. 07/394,600, filed Aug. 16, 1989, now U.S. Pat. No. 5,036,023.

FIELD OF THE INVENTION

This invention pertains to methods of making semiconductor devices. More particularly, it pertains to methods of making semiconductor devices based on III-V material, exemplarily InP-based photonic and electronic devices, e.g., lasers, LEDs and transistors.

BACKGROUND OF THE INVENTION

The need for making a non-rectifying (ohmic) contact to a semiconductor body exists throughout the semiconductor field. In the field of III/V-based semiconductors it has been conventional to use so-called alloyed contacts.

For instance, in order to make contact to the p-side of a InP-based laser diode or other 2-terminal device, it is conventional to evaporate onto p-doped semiconductor material a gold-based layer such as AuBe or AuZn (the use of "AuBe" and similar terms is conventional and does not imply equal amounts of Au and Be), followed by heating of the combination in a tube furnace for several minutes to cause alloying of the Au with the semiconductor surface and diffusion of Be (or Zn) into the underlying semiconductor material. Subsequent to this heat treatment a layer of barrier metal (Ti or Cr, followed by Pt or Pd) is typically deposited onto the alloyed layer, and the combination typically is again heat treated. This is typically followed by deposition of a relatively thick contact layer of gold, to permit wire bond attachment, or formation of a metallurgical solder bond to a Au-coated heat sink.

A similar process is conventionally used to provide a non-rectifying contact to the n-side of the laser or other two terminal device, with the principal differences being that the gold-based layer typically is AuGe, and that the alloying heat treatment is typically carried out at a somewhat lower temperature.

As can be seen from the above description, the conventional process is relatively complicated, typically requiring at least two different heat treatments, as well as typically, three metallizations per side. The resulting alloyed contacts typically are thermally stable only at relatively low temperatures, exemplarily less than about 320° C. Furthermore, there exists in the conventional process a significant potential for operator error due to the non-symmetrical nature of the alloying deposits. Also, conventional processing typically comprises thinning of the semiconductor body, which typically is carried out prior to the deposition of the n-side contact. The body (exemplarily a InP wafer which is later to be divided into a multiplicity of individual devices) is lapped or otherwise thinned to reduce its thickness from about 250 μm to about 80 μm, resulting in a very fragile body that can very easily be broken by insufficient care in handling.

Conventional alloyed contacts themselves are frequently subject to still other shortcomings. For instance, the alloying process can result in localized Au and Be (or Zn) penetration into the semiconductor material. Such penetration "spikes" may be associated with the occurrence of so-called "dark" defects in lasers or LEDs, and may also affect the long-term reliability of the devices.

In view of the shortcomings associated with conventional alloy contacts, alternative methods of forming non-rectifying contacts have been under investigation for some time, and non-alloyed ohmic contacts to III/V-based and other semiconductor bodies are known. Such contacts can be formed if an appropriate metal is deposited onto a heavily doped semiconductor. See, for instance, A. Y. C. Yu, *Solid State Electronics*, Vol. 13, pp. 239-247, reporting on electron tunneling and contact resistance of metal/silicon contact barriers.

A highly desirable characteristic of an ohmic contact is a relatively low specific contact resistance. It is known that there are two ways to achieve low specific contact resistance ohmic contacts. One is to form a very thin Schottky barrier (such that tunneling readily occurs) by heavily doping the semiconductor, and the other is to utilize materials with narrow energy band gap which result in low Schottky barrier height between the semiconductor body and the contact metal.

J. M. Woodall et al., *Journal of Vacuum Science and Technology*, Vol. 19 (3), pp. 626-627, have studied ohmic contacts on compositionally graded n-type $Ga_{1-x}In_xAs$ structures. These structures utilize the fact that for InAs surfaces Fermi level pinning occurs at or in the conduction band, resulting in a contact with a nearly zero Schottky barrier height. Other examples of studies of non-alloyed ohmic contacts to n-type III/V semiconductors are T. Nittono et al., *Japanese Journal of Applied Physics*, Vol. 25 (10), pp. L865-L867, and W. C. Dautremont-Smith et al., *Journal of Vacuum Science and Technology*, B2 (4), pp. 620-625.

Lasers and light emitting diodes (LEDs) that use non-alloyed ohmic contacts to the p-electrode are known. In particular, O. Ueda et al., *Journal of Applied Physics*, Vol. 54 (11), pp. 6732-6739, have studied InP-based LEDs with Ti/Pt/Au non-alloyed ohmic p-contact. A. R. Goodwin et al., *Journal of Lightwave Technology*, Vol. 6 (9), pp. 1424-1434, report on the design and realization of InP-based lasers that use a Ti/Pt/Au non-alloyed ohmic p-side contact, together with an alloyed n-side contact.

Sputtered Ni-P was shown to form an ohmic contact to n-type InP as well as p-type InGaAs, and also to act as a diffusion barrier. Specific contact resistances of $3 \times 10^{-6}$ Ω·cm² and $2 \times 10^{-5}$ Ω·cm² were observed for these n-type InP and p-type InGaAs contacts, respectively. See A. Applebaum et al., *IEEE Transactions on Electron Devices*, Vol. ED-34 (5), pp. 1026-1031. See also U.S. patent application Ser. No. 878,077, co-assigned with this, and incorporated herein by reference. As will be recognized by those skilled in the art, NiP-deposition is not a conventional process step in III/V-device manufacture. Furthermore, the above cited specific contact resistances are relatively high. Especially the p-side specific contact resistance is too high for some important III/V-based devices which are intended to operate at high current density, e.g., fast lasers, optical amplifiers, LEDs and transistors.

In view of the commercial importance of III/V semiconductor devices such as lasers and LEDs, a method of producing such devices that avoids the shortcomings associated with prior art contacts would be highly desirable. In particular, it would be highly desirable to have available a method that has fewer processing steps, especially fewer steps subsequent to the thinning of the wafer, that is less prone to operator error due to the absence of bilateral symmetry of the metallization, and that results in thermally stable, adherent, very low specific contact resistance ohmic contacts to both n- and p-type regions of the semiconductor device. This application discloses such a method.

SUMMARY OF THE INVENTION

In one aspect the invention is a method of making an article that comprises a semiconductor device, exemplarily a semiconductor laser, optical amplifier, or light emitting diode. The method comprises providing a semiconductor body that comprises a p-doped first semiconductor material and an n-doped second semiconductor material. At least the first semiconductor material comprises as major constituents both indium and arsenic. The first and second semiconductor materials form a first and a second surface, respectively, of the semiconductor body.

Exemplarily the method further comprises depositing a first conductor layer on the first surface and a second conductor layer on the first conductor layer, with the first and second conductor layers comprising Ti and Pt, respectively; and the method exemplarily still further comprises depositing a third conductor layer on the second surface and a fourth conductor layer on the third conductor layer, the third and fourth conductor layers also comprising Ti and Pt, respectively. Significantly, both n- and p-side metal layers are deposited prior to a single heat treatment, and can be symmetrical.

Subsequent to the deposition of the first to fourth conductor layers, the semiconductor body with the conductor layers thereon is heat treated, with the heat treatment comprising a "rapid thermal processing" (RTP) step that comprises heating the semiconductor body with the conductor layers thereon to a temperature and for a time adapted to result in a low specific contact resistance, typically below $10^{-6}$ $\Omega \cdot cm^2$, for at least one of the p-side and n-side contacts. Typically the temperature is in the range 400°-500° C., and the time is typically in the range 10-100 seconds. Currently preferred temperatures and times for processing InP-based devices are in the ranges 425°-475° C. and 15-60 seconds, respectively. Appropriate choice of RTP parameters can result in unexpectedly low specific contact resistance, exemplarily $10^{-7}$ $\Omega \cdot cm^2$ or even lower, for the p-side contact on InGaAs.

The inventive method also comprises a variety of conventional steps, exemplarily including epitaxial deposition of semiconductor layers on a semiconductor substrate, oxide deposition, photolithography, wet and/or dry etching, Au deposition, dicing or cleaving of a semiconductor wafer, AR-coating and mirror deposition, solder bonding and/or wire bonding, and device testing and packaging. Such processing steps are conventional and require no detailed discussion.

In a variant of the above-described exemplary embodiment a first intermediate layer (typically comprising Au and Be) is deposited onto the first semiconductor surface, followed by deposition of the first and second conductor layers. Optionally a second intermediate layer (typically comprising Au and Ge) is deposited onto the second semiconductor surface, followed by deposition of the third and fourth conductor layers. Typically the semiconductor body with the first intermediate layer thereon is subjected to a heat treatment (exemplarily RTP) prior to deposition of the other layers.

DETAILED DESCRIPTION OF SOME PREFERRED EMBODIMENTS

Although the invention is not so limited, the discussion below will be primarily in terms of devices wherein the first and second surfaces are on opposite sides of the semiconductor body, as is the case in conventional semiconductor lasers and LEDs. In "single side" devices the first and second surfaces are on the same side of the semiconductor body, and the inventive method can be particularly advantageously used to produce such devices as well as III-V-based transistors, as will be apparent to those skilled in the art.

A significant aspect of the invention is the presence of In and As in at least the first semiconductor material. Typically this material is the "contact layer" of the p-terminal of an inventive device. Exemplarily the contact layer is $In_{1-x}Ga_xAs$, with x typically in the range 0.1-0.9, exemplarily 0.47. The presence of both In and As at the metal/semiconductor interface is thought to result in a relatively low Schottky barrier, and thus make possible a low specific contact resistance contact.

Figure 1:
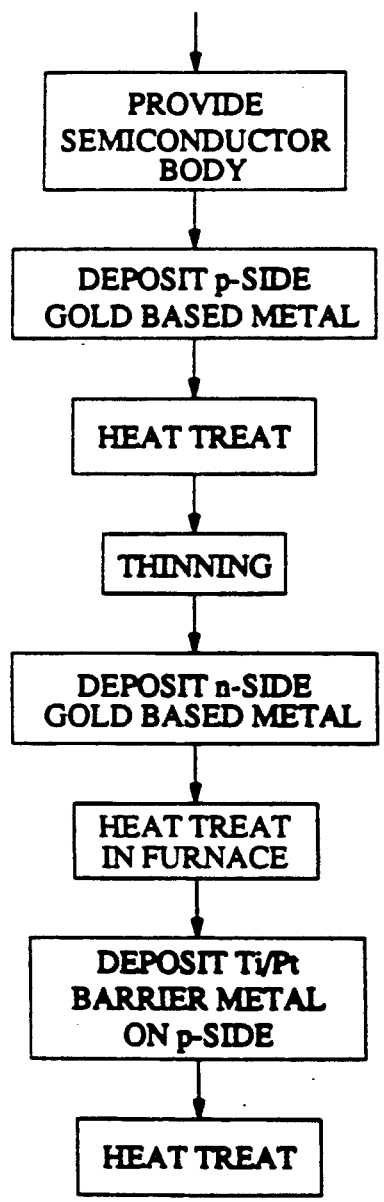
FIG. 1 shows the relevant portion of an exemplary prior art processing sequence.

In the practice of the inventive method, the semiconductor body can be prepared in conventional manner, and this preparation thus does not require detailed discussion. FIG. 1 shows, in form of a flow chart, steps involved in providing contact to the semiconductor body in an exemplary prior art processing sequence. As can be seen, the sequence comprises three different heat treatments. Furthermore, the n-side metal deposition, n-side alloying heat treatment, barrier metal deposition, and optional further heat treatment are carried out after thinning of the semiconductor body.

Figure 2:
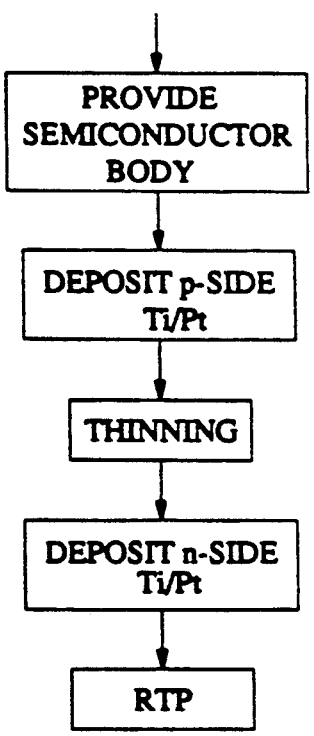
FIG. 2 shows the portion of an exemplary inventive processing sequence that corresponds to the portion of FIG. 1.

FIG. 2 shows the portion of an exemplary embodiment of the inventive process that corresponds to the steps shown in FIG. 1. The simplification of the process is immediately apparent. Furthermore, only two of the process steps are carried out subsequent to the (optional) thinning of the semiconductor body, substantially lessening the occurrence of breakage.

As shown in FIG. 2, on the first surface of the semiconductor body is deposited a Ti/Pt layer (e.g., 50 nm Ti, followed by 75 nm Pt, both deposited by e-beam evaporation), followed by (optional) thinning of the body to the desired thickness (e.g., lapping to a thickness of about 70-100 $\mu$m), which in turn is followed by deposition onto the second surface of a Ti/Pt metallization layer (typically of similar or same thickness as the above referred-to Ti/Pt layer). Subsequent to the deposition of both metallization layers the semiconductor body is heat treated. Advantageously the heat treatment is a RTP treatment, typically in forming gas or other protective (non-oxidizing) atmosphere.

By "RTP" we mean herein a heat treatment that involves rapid heating (typically <100 seconds) to the desired processing temperature, maintenance at that temperature for a relatively short time (typically <2 minutes, frequently <1 minute), followed by relatively rapid (though usually unforced) cooling to room temperature.

The temperature and time of the RTP are advantageously chosen such that the resulting specific contact resistance of at least one of the resulting ohmic contacts is relatively low, exemplarily $<10^{-6}$ $\Omega \cdot cm^2$. Typically, the conditions are chosen such that the specific contact resistance of at least one ohmic contact is no more than about 1% of that of the as-deposited contact.

Figure 3:
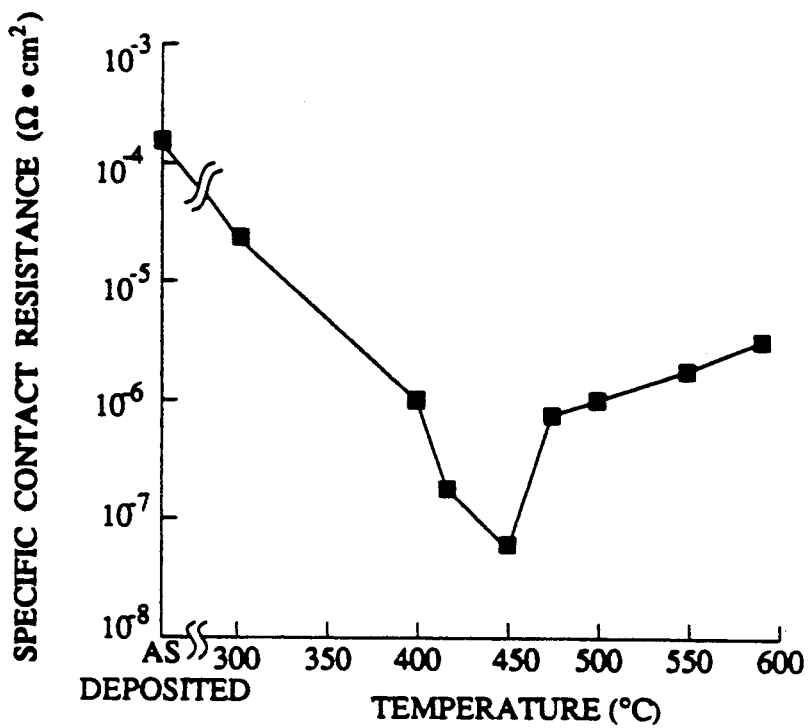
FIG. 3 shows the specific contact resistance of a small Ti/Pt layer on p-InGaAs as a function of the temperature of the RTP treatment.

FIG. 3 presents exemplary data on the specific contact resistance of an exemplary contact, namely, Pt(75 nm)/Ti(50 nm)/p-$In_{0.53}Ga_{0.47}As$. The figure demonstrates the surprising decrease in the specific contact resistance that can be attained through RTP with appropriately chosen temperature and time. Exemplarily, a 30 second RTP treatment at 450° C. lowered the specific contact resistance from about $10^{-4}$ $\Omega \cdot cm^2$ to below $10^{-7}$ $\Omega \cdot cm^2$. Generally, we believe that the time and temperature of the RTP advantageously are in the range 10–100 seconds and 400°–500° C., respectively, with the temperature range 425°–475° C. being currently preferred. Temperatures of 500° C. and above are considered to result in excessive interfacial mixing and/or reaction between the pure original contact compounds and the semiconductor. Conversely, temperatures of 400° C. and below are considered to cause insufficient reaction at the interface.

Those skilled in the art will appreciate that the length of the RTP treatment also typically affects the specific contact resistance, with shorter times generally possible if somewhat higher temperatures are used. The optimal combination of time and temperature generally can not be predicted. However, a very minor amount of experimentation will usually suffice to find an acceptable combination of time and temperature.

Figure 4:
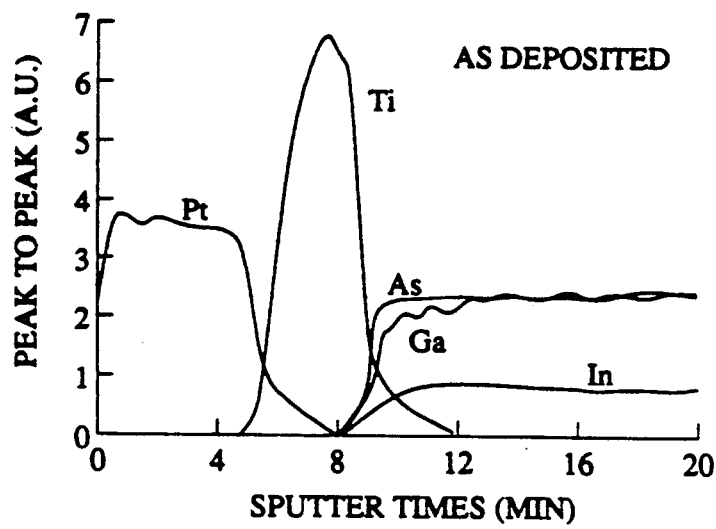
FIGS. 4-7 show exemplary Auger depth profiles of composition as a function of temperature in the RTP treatment.
Figure 5:
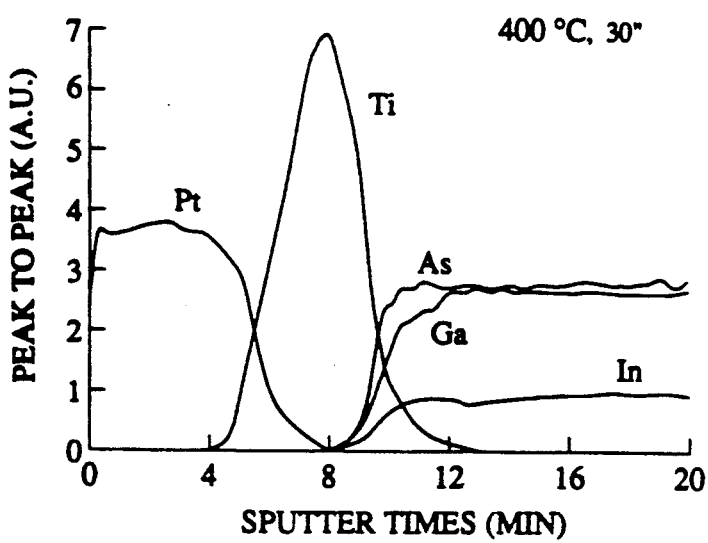
Figure 6:
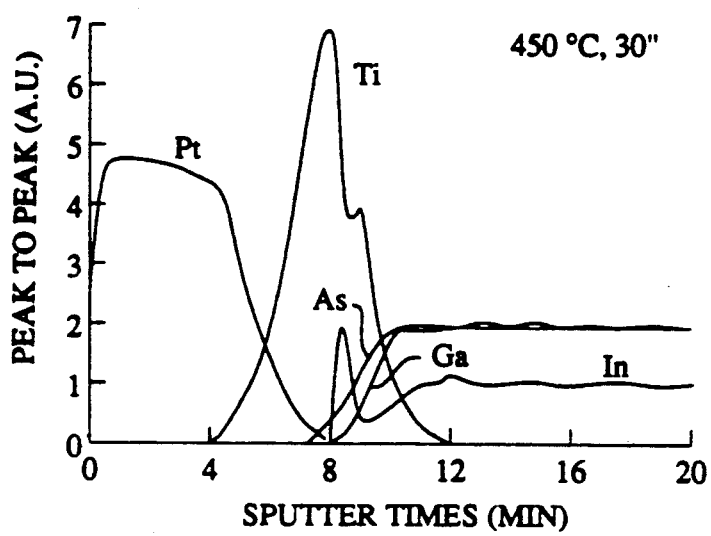
Figure 7:
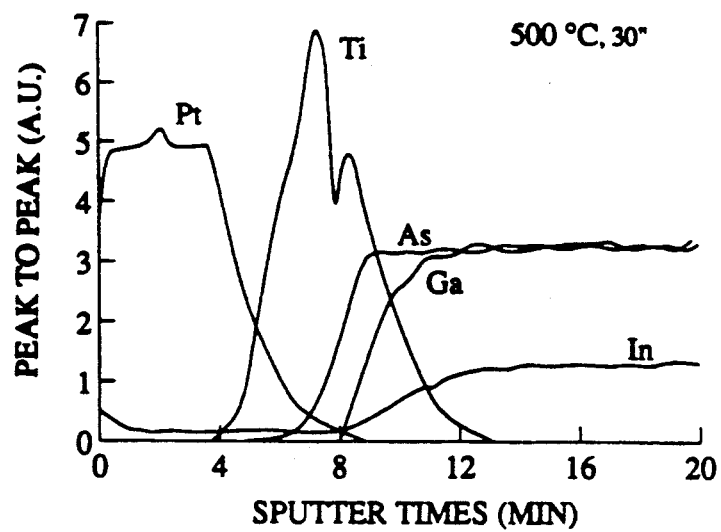

FIGS. 4–7 show exemplary compositional depth profiles of Pt(75 nm)/Ti(50 nm)/p-$In_{0.53}Ga_{0.47}As$ contacts, obtained by Auger electron spectroscopy. FIG. 4 shows an as-deposited profile, and FIGS. 5–7 pertain to contacts produced using 30 second RTPs at 400°, 450°, and 500° C., respectively. FIGS. 4 and 5 are essentially identical, showing that RTP at 400° C. did not result in any significant reaction at the interface. RTP at 450° C. induced observable reaction at the Ti/InGaAs interface, creating a mixed zone composed of Ti, As, and In. RTP at 500° C. induced further mixing at the interface, together with significant out-diffusion of In to the contact surface.

Study of the interfaces by cross-sectional transmission electron microscopy and other techniques showed that, for RTP at about 450° C., the Ti/InGaAs interface region contained a significant amount of the InAs phase. This is considered to be significant, in view of the known low bandgap energy of InAs (0.36 eV). Other phases observed were $InTi_3$, $Ga_3Pt_5$, $GaPt$, $Ti_2Ga_3$, and $In_2Pt$.

Figure 8:
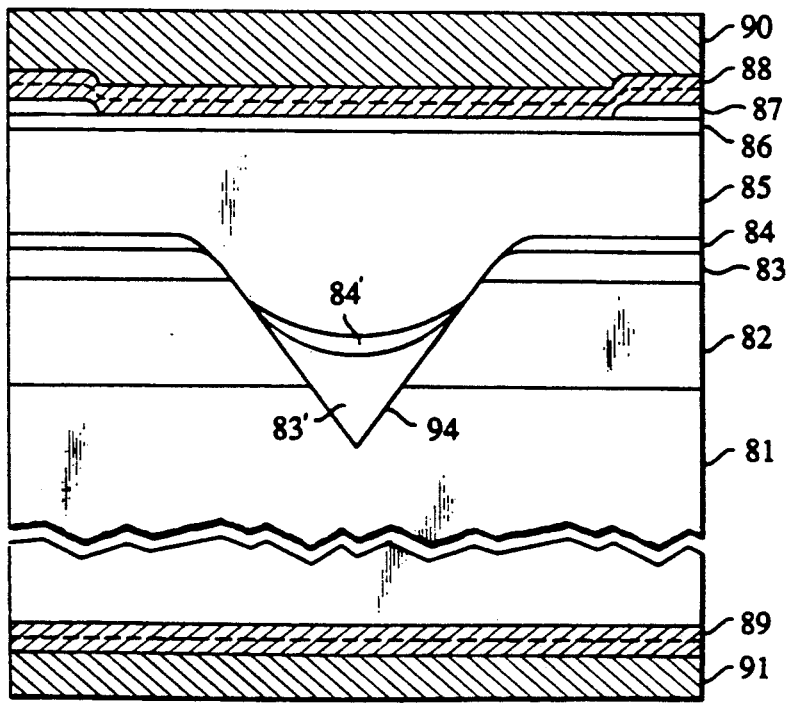
FIGS. 8 and 9 schematically depict exemplary devices according to the invention.

FIG. 8 schematically depicts an exemplary device according to the invention, namely a channeled substrate buried heterostructure (CSBH) laser diode 80. The laser comprises n-InP substrate 81, semi-insulating Fe-doped InP layer 82, n-InP buffer layer 83 and 83', InGaAsP layer 84 and 84' (active layer), p-InP cladding layer 85, and p+InGaAs layer 86. The laser further comprises patterned $SiO_2$ layer 87 defining the p-contact region, with Ti/Pt layer 88 and Au layer 90 providing p contact, and Ti/Pt layer 89 and Au layer 91 providing n contact.

EXAMPLE

A CSBH laser chip as shown in FIG. 8 is produced substantially as follows.

On a (100)-oriented 275 μm thick, n-InP ($10^{18}$ $cm^{-3}$ sulfur doped) substrate is grown an epitaxial semi-insulating Fe-doped (resistance greater than $10^6$ $\Omega cm$) 2 μm thick InP layer by conventional organometallic vapor phase epitaxy (OMVPE). After treating the surface in a manner substantially as described in U.S. Pat. No. 4,595,454, (incorporated herein by reference), a 0.3 μm thick $SiO_2$ layer is formed by plasma deposition, and 2 μm wide stripe windows opened in the $SiO_2$ layer by conventional photolithography and etching. Next, V-grooves are formed also substantially as described in U.S. Pat. No. 4,595,454, and the patterned $SiO_2$ layer is removed by conventional wet etching. A double heterostructure, consisting of a 1 μm thick n-InP layer, an InGaAsP layer that is lattice matched to the InP and has a bandgap of 1.3 μm, a p-InP layer, and a p+InGaAs layer, is then grown by conventional liquid phase epitaxy (LPE) on the grooved surface of the wafer. After completion of the LPE growth, the p-contacts are formed. In particular, a 300 nm thick layer of $SiO_2$ is formed on the p-side surface by plasma deposition, and stripes, overlying the V-grooves, are opened in the $SiO_2$ layer by conventional photolithography and etching. Next, a 50 nm thick Ti layer, followed by a 75 nm thick Pt layer, are deposited by e-gun evaporation, followed by removal of unwanted Ti/Pt by conventional lift-off. The wafer is then thinned to about 80 μm by conventional lapping and wet etching. This is followed by formation of the n-contacts, in the same manner the p-contacts have been formed previously. Next the wafer is subjected to a RTP treatment, by heating in a forming gas (15% b.v. $H_2$) atmosphere to 440° C. for 30 seconds. This is followed by photolithography and conventional electrodeposition of a 0.8 μm thick gold layer on each of the n- and p-sides of the wafer, to form the n- and p-contact pads, respectively. Next the wafer is scribed and cleaved to form chips with high-quality laser mirror facets, and the thus produced laser chips are tested by conventional means. The metal layers form ohmic contacts, with the p-contacts having a specific contact resistance of less than $10^{-7}$ $\Omega \cdot cm^2$. The thus produced lasers typically perform as expected, and show good long-term stability.

In some embodiments of the inventive process the first and/or third conductor layers are not deposited directly onto the first and second semiconductor regions but instead are deposited onto a previously deposited Au-containing thin (typically <100 nm) intermediate layer. Use of such an intermediate layer in one or both of the contacts at least in some cases can result in increased device yield and/or lifetime. Although these embodiments of the inventive process comprise the RTP step subsequent to deposition of the 1st–4th conductor layers, they may comprise an optional heat treatment step (typically also RTP) prior to deposition of any of the 1st–4th conductor layers.

Exemplarily, the p-side contact comprises a 5–80 nm thick AuBe intermediate layer and a relatively thick (e.g., 250–750 nm) Au layer on the second conductor layer. Furthermore, the n-side contact structure exemplarily comprises a 7-20 nm thick AuGe intermediate layer and a top Au layer similar to that on the p-side contact. Techniques for depositing AuBe and AuGe layers are well known in the art. Exemplarily, all of the layers on both the p-side and n-side contacts are formed by means of electron beam evaporation.

Figure 9:
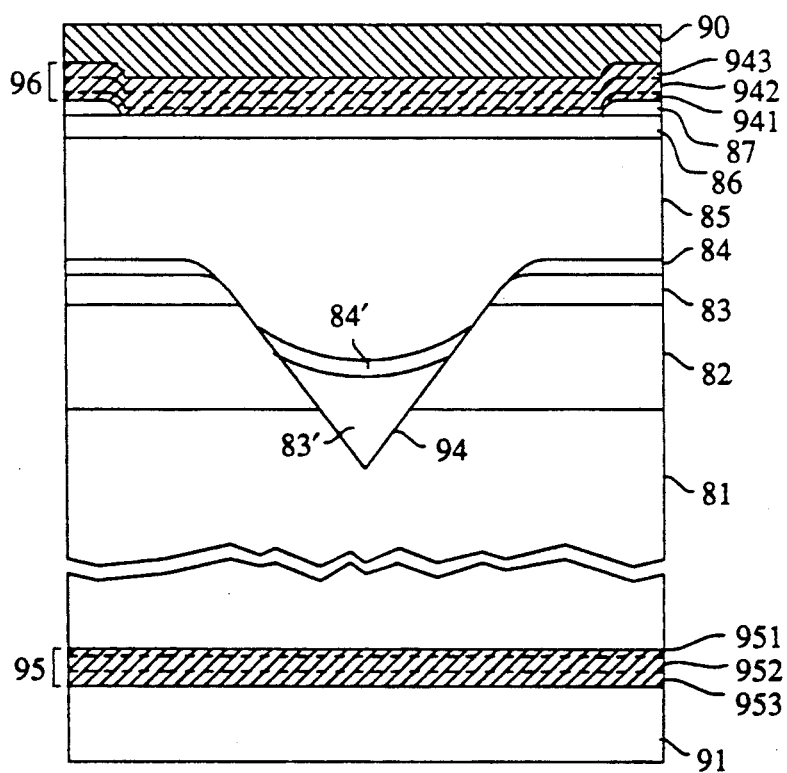

FIG. 9 schematically depicts an exemplary CSBH laser diode according to the invention. Numerals 95 and 96 refer to the first and second contact material, respectively. Each contact material layer comprises an intermediate layer (941 or 951), Ti layer (942 or 952) and Pt layer (943 or 953).

We claim:

1. A method of making an article comprising a semiconductor device, the method comprising
   a) providing a semiconductor body that comprises a p-doped first semiconductor material comprising both In and As, and that further comprises a n-doped second semiconductor material, the first and second semiconductor materials forming a first and a second surface of the body, respectively;
   b) depositing first contact material onto the first surface;
   c) heat treating the semiconductor body with the contact material thereon; and
   d) completing making the article; characterized in that
   e) step b) comprises depositing, in sequence,
      i) a first intermediate layer that comprises Au;
      ii) a first conductor layer that comprises Ti; and
      iii) a second conductor layer that comprises Pt;
   f) the method further comprises depositing, prior to step c), second contact material onto the second surface, the second contact material comprising third and fourth conductor layers that comprise Ti, and Pt, respectively, the fourth conductor layer disposed on the third conductor layer; and
   g) step c) comprises a "rapid thermal processing" (RTP) step that comprises heating the semiconductor body with the contact material thereon to a temperature in the range 400°-500° C. for a time in the range 10-100 seconds, whereby ohmic contacts to the first and second semiconductor materials are formed simultaneously.

2. The method of claim 1, wherein step f) comprises depositing a Au-containing second intermediate layer onto the second surface, with the third conductor layer disposed on the second intermediate layer.

3. The method of claim 1, comprising heat treating the body with the first intermediate layer thereon prior to deposition of the first conductor layer.

4. The method of claim 3, wherein said heat treating prior to deposition of the first conductor layer comprises heating the semiconductor body with the first intermediate layer thereon to a temperature in the range 400°-500° C. for a time in the range 10-100 seconds.

5. The method of claim 2, wherein the first intermediate layer consists essentially of Au and Be, the first and second conductor layers consist essentially of Ti and Pt, respectively, the second intermediate layer consists essentially of Au and Ge, and the third and fourth conductor layers consist essentially of Ti and Pt, respectively.

6. The method of claim 2, further comprising depositing a Au-containing layer onto each of the second and fourth conductor layers.

* * * * *